United States Patent [19]
Collins et al.

[11] 4,375,955
[45] Mar. 8, 1983

[54] FLASH LAMP ARRAY CIRCUIT WITH IMPROVED FUSE MEANS

[75] Inventors: Edward J. Collins, Mentor-on-the-Lake; Mary E. Suster, Chagrin Falls, both of Ohio

[73] Assignee: General Electric Company, Schenectady, N.Y.

[21] Appl. No.: 205,411

[22] Filed: Nov. 10, 1980

[51] Int. Cl.³ .......................... F21K 5/00; G03B 15/02
[52] U.S. Cl. ...................................... 431/359; 362/13
[58] Field of Search ................. 431/359; 362/4, 6, 11, 362/13, 16, 15

[56] References Cited
U.S. PATENT DOCUMENTS

| | | | |
|---|---|---|---|
| 4,133,631 | 1/1979 | Collins | 362/13 |
| 4,154,569 | 5/1979 | Van Werkhoven | 362/15 |
| 4,290,747 | 9/1981 | Collins | 362/13 |
| 4,290,748 | 9/1981 | Collins | 362/13 |

*Primary Examiner*—Samuel Scott
*Attorney, Agent, or Firm*—John F. McDevitt; Philip L. Schlamp; Fred Jacob

[57] ABSTRACT

A flash lamp array circuit having radiation-sensitive switches and fuse elements being connected in the conductive carbon ink circuit pattern wherein each of said fuse elements comprises a plurality of spaced apart strips to provide more reliable thermal decomposition and increased electrical conductivity.

7 Claims, 1 Drawing Figure

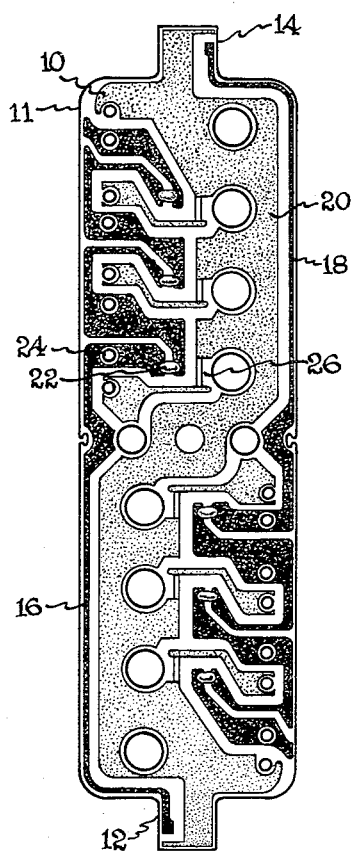

FLASH LAMP ARRAY CIRCUIT WITH IMPROVED FUSE MEANS

CROSS REFERENCE TO RELATED APPLICATIONS

In U.S. patent application Ser. No. 205,413, filed Nov. 10, 1980, in the name of M. E. Suster, there is described and claimed a modified conductive ink for flash lamp array circuit containing a particulated electrically conductive material such as graphite or metal flakes, metal coated glass spheres and the like. Increased electrical conductivity is obtained in this manner to improve flashability and electrostatic flash out protection for the associated flash lamps. The preferred embodiments further include use of the same modified conductive ink to serve as integral fuse elements in the circuit pattern by narrowing the width of said circuit pattern at the fuse locations and said preferred embodiments can further locate both radiation switches and fuse elements adjacent to the flash lamps for simultaneous actuation when the adjoining flash lamp is flashed.

In another U.S. Patent Application Ser. No. 204,413, filed Nov. 10, 1980, in the names of E. J. Collins and M. E. Suster, and also assigned to the present assignee, there is described and claimed a different modified conductive carbon ink for a flash lamp array circuit and which operates in the same general manner as the first mentioned co-pending application. Operational improvement of the fuse elements in the flash lamp array circuit is obtained by modification of the conductive carbon ink to further include a particulated electrically conductive and radiation-absorbing material providing increased residual electrical resistance and dielectric standoff capability after the fuse elements have been actuated.

BACKGROUND OF THE INVENTION

The already known fuse element construction in a flash lamp array circuit, as more fully explained in both above referenced co-pending patent applications, simply comprises a more narrow width of the circuit pattern at the fuse location than the remaining width of said circuit pattern elsewhere. Fuse operation takes place when a flash lamp located adjacent to a given fuse element is flashed producing light and/or heat which is absorbed by the fuse material whereupon the more narrow fuse element portions of said circuit pattern become sufficiently thermally decomposed to disrupt the electrical connection to the activating flash lamp. While it is not essential for the fuse element portions of said circuit pattern to be completely decomposed and form an opening entirely across the width of the circuit pattern since a lesser physical separation such as multiple cracks in the circuit pattern at the fuse locations can raise the dielectric breakdown voltage of the opened fuse elements sufficiently to block a subsequently applied firing pulse, there is always a requirement for reliable fuse operation that the circuit path be interrupted by a sufficient physical discontinuity. Reliable fuse operation has also now become more difficult by reason of a recent introduction of lower intensity flash lamps which produce a lesser amount of radiation to actuate the individual fuse elements. An improved fuse element construction exhibiting more reliable operation is thereby still an important consideration for the proper sequential firing of the flash lamp array. A related important consideration in modifying said fuse element construction is the electrical conductivity of the fuse element before actuation because of the high electrical resistance characteristic of the carbon ink material. Accordingly, it would not be desirable to simply narrow the width of the fuse element beyond that now used since doing so would increase electrical resistance at the fuse locations and make flashing of the associated flash lamps more difficult. It would thereby be more beneficial to modify the fuse element construction in a manner which increases the operational reliability while not contributing to increased difficulty in the operation of the overall sequential firing circuit.

SUMMARY OF THE INVENTION

The foregoing objectives along with still other important objects are achieved in accordance with the present invention by having each of the fuse elements in the form of a plurality of spaced apart strips in the circuit pattern. More particularly, the present fuse element construction comprises spaced apart strips at the fuse locations which are each more narrow in width than a circuit pattern and are preferably formed so that the aggregate width and thickness of said strips will be less than the width and thickness of said circuit pattern. Thermal decomposition of the individual fuse strips is enhanced in this manner while electrical conductivity across such parallel circuit strips in the circuit pattern is adequate before fuse actuation for reliable flashing of the associated flash lamps. While both of the modified carbon inks disclosed in the aforementioned co-pending applications can be suitably employed in the present fuse element construction, it is preferred that the conductive carbon ink contain a particulated electrically conductive material imparting improved radiation absorption as well, such as conductive carbon. The increased radiation absorption imparted to the fuse elements in this manner provides a more complete thermal decomposition and which is accompanied by the formation of more physical discontinuities in the thermally decomposed residue than when the modified carbon ink contains larger size and flake-like conductive particles, such as graphite flakes.

Briefly, the presently improved photoflash array comprises a plurality of high voltage type flash lamps connected to a lamp firing circuit pattern of conductive carbon ink deposited on a circuit board with radiation-sensitive switches and fuse elements being connected in said circuit pattern for sequential firing of said flash lamps, said fuse elements being provided by narrowing the width of the circuit pattern at the fuse locations to undergo thermal decomposition when activated with radiation, wherein the improvement comprises each of said fuse elements being a plurality of spaced apart strips. In one preferred embodiment, the radiation switches and fuse elements are located adjacent said flash lamps for simultaneous activation of an adjoining switch and fuse element. A different preferred embodiment electrically connects the flash lamps in parallel branch circuits having a radiation switch connected between one side of said pair of successively connected flash lamps and the radiation-sensitive fuse element parallel connected in the branch circuits.

BRIEF DESCRIPTION OF THE DRAWING

The accompanying drawing is a perspective view of a flash array circuit board in accordance with a preferred embodiment of the invention.

DESCRIPTION OF THE PREFERRED EMBODIMENTS

In the preferred circuit board embodiment depicted in the accompanying drawing, both radiation-sensitive switches and radiation-sensitive fuse elements are deposited on the circuit pattern adjacent to flash lamp locations for simultaneous actuation of each adjoining switch and fuse element by radiation being emitted from an adjacent flash lamp. Accordingly, a lamp firing circuit pattern 10 is shown having been deposited on the circuit board member 11 preferably in the form of a thermoplastic organic polymer material and with said circuit pattern including a plurality of modified fuse elements according to the present invention as an integral part of the circuit pattern. The circuit board member 11 also includes connector tabs 12 and 14 located at each end for insertion of said circuit board member into an associated camera socket (not shown). The camera socket has contacts for conductor lines 16, 18 and 20 of the lamp firing circuit pattern to connect four flash lamps in parallel between conductor lines 16 and 20 when connector tab 12 has been inserted in the camera socket. Correspondingly, the second group of four lamps is connected between conductor lines 18 and 20 when connector tab 14 has been inserted into the camera socket. As can be noted, conductor line 20 provides a common electrical ground for all flash lamps in the array with one lead-in wire of each flash lamp being connected thereto while the remaining lead-in wire of each flash lamp is either connected to conductor line 16 or 18 for application of the high voltage firing pulses to individual lamps in the array. While an entire illustrated circuit board is shown, there is need to discuss only a single group of four flash lamps since the operation of the second group of four flash lamps is essentially the mirror image of the first lamp group. Accordingly, conductor line 16 includes a serially connected arrangement of radiation switches 22 to prevent the flash lamps of the group from all being fired together on release of the camera shutter. Functionally, each of said radiation switches are serially connected between the parallel connected lamp branch circuits and the switches employ a material exhibiting an open circuit or high resistance commission before actuation which converts to a low resistance by absorption and/or light from an adjoining flash lamp when flashed. As can be noted, said radiation switches are each located adjacent to a flash lamp termination 24 so that the light and heat released when the lamp is flashed operates to convert the adjacent switch to an electrically conductive state, thereby establishing the current path to the next lamp to be flashed. Assuming that none of the four lamps in the upper four-lamp group of said circuit pattern have been flashed, upon occurrence of the first firing pulse across the conductor lines 16 and 20, this pulse is applied to the lead-in wires of the first connected flash lamp and flashes this lamp to become an open circuit between its lead-in wires. Actuation of the radiation-sensitive switch located adjacent said lamp at this time provides a low resistance circuit path to the lead-in wires of the second lamp in the four-lamp sequence thereby connecting the second lamp to the circuit board terminals for flashing when the next firing pulse is applied. Successive flashing of the remaining lamps in the four-lamp group facilitated by closing of the cooperating radiation switches completes the desired sequential mode of operation. The integral fuse elements 26 provided in the circuit pattern according to the present invention each constitute a pair of generally parallel strips having a more narrow width than the width of the circuit path elsewhere and as can be noted in the embodiment shown, said plurality of the spaced apart strips have been formed so that the aggregate width as well as thickness of said strips is less than the width and thickness of said circuit pattern elsewhere. A further location of both radiation-sensitive switch elements 22 as well as the present fuse elements 26 adjacent to the flash lamps provides for interruption or impedance of the circuit path when an adjoining flash lamp is flashed to the activated flash lamp while a cooperating radiation switch furnishes an electrical path to the next unflashed lamp in the customary manner.

To demonstrate the improved operational reliability attributable to the presently modified fuse element construction, a comparative test evaluation was carried out with the firing circuit configuration above described. Specifically, the thermal decomposition of single strip fuse elements having a 0.030 inch width were compared with fuse elements having a pair of strips each 0.015 inch in width. Only 38% of the single strip fuse elements tested underwent satisfactory thermal decomposition when the illumination level from the adjoining flash lamp had been reduced to approximately 36% whereas 93% of the paired strip fuse elements thermally decomposed at the same test conditions. It is thereby apparent from said test evaluation that the presently modified fuse element construction provides much greater operational reliability in the circuit pattern.

While preferred embodiments of the invention have been shown and described, various other embodiments and modifications thereto will become apparent to the person skilled in the art. It is thereby intended to limit the present invention only by the scope of the following claims.

What we claim as new and desire to secure by Letters Patent of the United States is:

1. An improved photoflash array having a plurality of high voltage type flash lamps connected to a lamp firing circuit pattern of conductive carbon ink deposited on a circuit board with radiation-sensitive switches and fuse elements being connected in said circuit pattern for sequential firing of said flash lamps, said fuse elements being provided by narrowing the width of the circuit pattern at the fuse locations to undergo thermal decomposition when activated with radiation, wherein the improvement comprises each of said fuse elements being a plurality of spaced apart strips.

2. A photoflash array as in claim 1 wherein the radiation switches and fuse elements are located adjacent said flash lamps for simultaneous activation of an adjoining switch and fuse element.

3. A photoflash array as in claim 1 wherein the conductive carbon ink contains a particulated electrically conductive material.

4. A photoflash array as in claim 1 wherein the conductive carbon ink contains a particulated electrically conductive radiation-absorbing material.

5. A photoflash array as in claim 2 wherein the flash lamps are electrically connected in parallel branch circuits having a radiation-sensitive switch connected between one side of each pair of successively connected flash lamps and a radiation-sensitive fuse element also connected in said branch circuits.

6. A photoflash array as in claim 1 wherein said plurality of spaced apart strips is formed so that the aggregate width and thickness of said strips is less than the width and thickness of said circuit pattern elsewhere.

7. A photoflash array as in claim 5 wherein the conductive carbon ink contains a particulated electrically conductive radiation-absorbing material.

* * * * *